Nov. 1, 1960 B. H. CLAUSSEN 2,958,633

MANUFACTURE OF SEMI-CONDUCTOR DEVICES

Filed Feb. 11, 1958

Inventor
B. H. CLAUSSEN
By [signature]
Attorney

United States Patent Office 2,958,633

Patented Nov. 1, 1960

2,958,633

MANUFACTURE OF SEMI-CONDUCTOR DEVICES

Brian Harry Claussen, London, England, assignor to International Standard Electric Corporation, New York, N.Y., a corporation of Delaware Filed Feb. 11, 1958, Ser. No. 714,597

Claims priority, application Great Britain Feb. 22, 1957

3 Claims. (Cl. 204—32)

Figure 1:
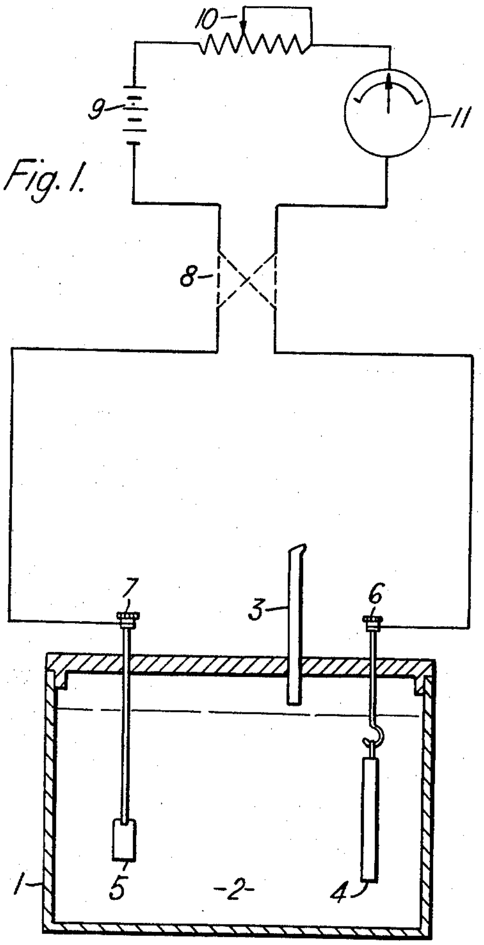

This invention relates to improvements in the manufacture of semi-conductor devices.

Materials such as germanium and silicon whose electrical conductivity lies between that of insulators and metals are commonly called semi-conductors.

When using semi-conductor materials for the production of devices such as rectifiers, photo-cells, crystal diodes and transistors, it is usually desirable to make at least one intimate contact with the material having a substantially non-ohmic resistance.

In order for an electrode to make satisfactory contact with the semi-conductor, it is essential that the surface of the semi-conductor (which receives the electrode) be free of impurities, contaminating oxide layers, and crystal imperfections.

The presence of an oxide layer on silicon, and to a certain extent germanium, causes some difficulty in both the measurement of the properties of the materials, and in the manufacture of semi-conductor devices in which the materials are used.

For example, the preparation of a good soldered contact with the surface of the material, which contact is substantially non-ohmic, necessitates the plating of the surface on which the contact is to be made. The oxide layer present on such a surface causes the plating to be poorly adherent, and in consequence a poor contact results.

One of the most difficult problems in the semi-conductor field is how to treat the surface so as to remove these obstacles which prevent satisfactory contact.

Extensive work has been done using aqueous media for etching the surface of the crystal. However, aqueous media generates nascent oxygen at the semi-conductor surface, thereby oxidising the surface. To solve this problem, agents have been added to the media to dissolve the oxide. However, the crystal then must be thoroughly washed to remove the etch and this causes reoxidation of the surface.

Accordingly, it is an object of my invention to provide a novel solution for the etching of semi-conductor materials which is capable of removing the obstacles described above.

It is a further object of my invention to provide a process for plating an electrode on the etched surface.

In accordance with one aspect of the invention, I provide a method for cleaning the surface of a semi-conductor by electrolytic etching in a non-aqueous solution of an inorganic salt which is devoid of oxygen and of high dielectric constant.

In accordance with another aspect of the invention, I provide a method for cleaning and plating the surface of a semi-conductor by utilising an electrolytic bath consisting of a non-aqueous solution of an inorganic salt which is devoid of oxygen and of high dielectric constant.

Further aspects of the invention comprise equipment for carrying out the above methods, and semi-conductor devices in the production of which the above methods have been used.

The above-mentioned and other features and objects of this invention will become apparent by reference to the following description taken in conjunction with the accompanying drawing wherein equipment for etching and plating is illustrated.

Before referring to the drawing, it should be clearly borne in mind that the desiderata of my invention is a result of the etching treatment which produces a crystal free of contaminting oxide layers.

In order to achieve these desiderata, three critical conditions must be fulfilled: (1) the etching media must be non-oxidising, (2) the etching media must be ionising, to permit the application of electrolytic action, and (3) the etching solution must produce cations which are non-oxidising and anions suitable for metallic plating.

Fulfillment of the first condition rules out aqueous etching solutions which generate nascent oxygen at the semi-conductor surface during etching.

Fulfillment of the second condition requires an etching media of high dielectric constant which reduces electrostatic binding forces between the ions of the etching solute. There is no upper limit to the dielectric constant. The lower limit depends upon the particular solute used and the lower the dielectric constant, the lower the degree of ionisation. The important factor therefore, is that the solvent be ionising and the dielectric constant is a guide for choosing the most suitable solvent.

The solutes may vary widely, typical examples being metallic halides. The discharged halogen ion attacks the semi-conductor during etching and the discharged metal ion deposits during plating. It is a result of this wide choice that specific solute can be chosen according to the result desired.

Referring now to the drawing, an enclosed vessel 1 contains a saturated solution of copper chloride and formamide which is devoid of oxygen and of high dielectric constant, for example, 5 grams of copper chloride per 100 cubic centimeters of formamide.

Copper chloride was chosen for processes involving the etching of germanium, because it was desired to use copper for the non-ohmic contact. Copper is particularly suitable because the discharged chloride ion reacts with germanium. Other metals, which may be used for the anion are lead, zinc, tin, nickel, iron, cobalt, etc. There is no limitation, providing the solutes are soluble and ionizable in the chosen solvent.

Formamide was chosen on the basis of its high dielectric constant (greater than 80). It is also one of the few organic solvents comparable with water in this respect, and also for its lack of oxygen in a ready available form. Other solvents with dielectric constants exceeding 20 could be used with a suitable choice of solutes.

Since the formamide is hygroscopic, it is necessary to carry out the etching and plating processes in the dry atmosphere of an inert gas, this is achieved by introducing a stream of, for example, argon from an exterior source, not shown, into the enclosed vessel via tube 3. A copper rod 4, forming the metal electrode, and, for example, a germanium crystal 5 are suspended in the solution from terminals 6 and 7, and connected through reversing switch 8 to a source of electric potential 9. A suitable current controller 10, and milliameter 11 are included in the circuit to control and indicate the current density in the solution. It has been found that a current density of between 40 and 100 milliamperes per square centimeter of semi-conductor surface produces good etching and plating results.

While I have described above the principles of my invention in connection with specific compositions, it is to be clearly understood that this description is made only by way of example and not as a limitation to the scope of my invention as set forth in the objects thereof and in the accompanying claims.

What I claim is:

1. A method of cleaning and plating the surface of a semi-conductor which consists of immersing both the semi-conductor and an electrode of plating metal into a non-aqueous solution consisting of a saturated solution of copper chloride in formamide, which solution is devoid of oxygen and of high dielectric constant, cleaning the surface by passing an electric current between the metal electrode and the semi-conductor in one direction to etch the semi-conductor surface and plating the cleaned surface by passing current in the opposite direction to plate the etched surface.

2. A method as claimed in claim 1 wherein the said method is performed in an atmosphere of an inert gas.

3. A method as claimed in claim 1 wherein the current density per $cm.^2$ of semi-conductor surface is 40 to 80 ma.

References Cited in the file of this patent

UNITED STATES PATENTS

| | | |
|---|---|---|
| 827,802 | Hollis | Aug. 7, 1906 |
| 2,119,936 | White | June 7, 1938 |
| 2,763,605 | Miller et al. | Sept. 18, 1956 |
| 2,854,387 | Zimmerman | Sept. 30, 1958 |

OTHER REFERENCES

Tiley et al.: Proceedings of the I.R.E., December 1953, pp. 1706–1708.

Journal of the Electrochemical Society, October 1955, pp. 586–593.

Bell System Technical Journal, vol. 35, March 1956, by Uhlir, pp. 344 to 347 pertinent.